(12) United States Patent
Li et al.

(10) Patent No.: US 11,538,870 B2
(45) Date of Patent: Dec. 27, 2022

(54) FLEXIBLE DISPLAY PANEL, FLEXIBLE DISPLAY DEVICE AND DEFORMATION DETECTION METHOD THEREOF

(71) Applicants: Chengdu BOE Optoelectronics Technology Co., Ltd., Chengdu (CN); BOE Technology Group Co., Ltd., Beijing (CN)

(72) Inventors: Wenqiang Li, Beijing (CN); Ling Shi, Beijing (CN); Ke Liu, Beijing (CN); Bingqiang Gui, Beijing (CN)

(73) Assignees: Chengdu BOE Optoelectronics Technology Co., Ltd., Sichuan (CN); BEIJING BOE TECHNOLOGY, Beijing (CN)

( * ) Notice: Subject to any disclaimer, the term of this patent is extended or adjusted under 35 U.S.C. 154(b) by 123 days.

(21) Appl. No.: 17/043,205

(22) PCT Filed: Mar. 17, 2020

(86) PCT No.: PCT/CN2020/079758
§ 371 (c)(1),
(2) Date: Sep. 29, 2020

(87) PCT Pub. No.: WO2020/224333
PCT Pub. Date: Nov. 12, 2020

(65) Prior Publication Data
US 2021/0376012 A1  Dec. 2, 2021

(30) Foreign Application Priority Data

May 6, 2019 (CN) .......................... 201910373155.2

(51) Int. Cl.
*H01L 27/32* (2006.01)
*H01L 41/113* (2006.01)
*H01L 51/00* (2006.01)

(52) U.S. Cl.
CPC ...... *H01L 27/3225* (2013.01); *H01L 41/1132* (2013.01); *H01L 51/0097* (2013.01)

(58) Field of Classification Search
CPC ............. H01L 27/3225; H01L 41/1132; H01L 51/0097
See application file for complete search history.

(56) References Cited

U.S. PATENT DOCUMENTS

2013/0222289 A1   8/2013   Kwak
2013/0342439 A1  12/2013   Kwack et al.
(Continued)

FOREIGN PATENT DOCUMENTS

| CN | 102339166 A | 2/2012 |
| CN | 106020553 A | 10/2016 |

(Continued)

OTHER PUBLICATIONS

CN201910373155.2 OA1.

*Primary Examiner* — David Vu
*Assistant Examiner* — Brandon C Fox
(74) *Attorney, Agent, or Firm* — IPRO, PLLC (57) ABSTRACT

Disclosed are a flexible display panel, a flexible display device and a deformation detection method thereof, used for detecting deformation of the flexible display panel. The flexible display panel provided by embodiments of the present disclosure includes a flexible substrate, a display device and a piezoelectric sensor arranged in a stacked mode. The piezoelectric sensor includes a first electrode, a second electrode, and a piezoelectric layer positioned between the first electrode and the second electrode; the piezoelectric sensor is configured to generate an electrical signal under the action of stress produced by bending the flexible display panel; and a signal processing chip in the flexible display device is configured to determine deforma-
(Continued)

tion parameters of the flexible display panel according to the electrical signal.

11 Claims, 5 Drawing Sheets

(56) References Cited

U.S. PATENT DOCUMENTS

| | | | |
|---|---|---|---|
| 2016/0313793 A1* | 10/2016 | Hong | G06F 3/0416 |
| 2018/0321783 A1* | 11/2018 | Guo | G06F 3/0412 |
| 2019/0286266 A1 | 9/2019 | Bu et al. | |
| 2020/0169625 A1* | 5/2020 | Shim | H04M 1/0277 |
| 2020/0279087 A1* | 9/2020 | Seo | G01S 7/52079 |
| 2020/0296493 A1* | 9/2020 | Won | H04R 1/2819 |
| 2020/0341516 A1 | 10/2020 | Huang et al. | |

FOREIGN PATENT DOCUMENTS

| | | | | |
|---|---|---|---|---|
| CN | 207116427 U | | 3/2018 | |
| CN | 108231800 A | | 6/2018 | |
| CN | 108365118 A | * | 8/2018 | ......... H01L 27/3225 |
| CN | 108388379 A | | 8/2018 | |
| CN | 108877516 A | | 11/2018 | |
| CN | 110098233 A | | 8/2019 | |
| KR | 20160080955 A | * | 7/2016 | |
| WO | WO-2019222919 A1 | * | 11/2019 | |

* cited by examiner

FLEXIBLE DISPLAY PANEL, FLEXIBLE DISPLAY DEVICE AND DEFORMATION DETECTION METHOD THEREOF

CROSS-REFERENCE TO RELATED APPLICATIONS

The present disclosure is a National Stage of International Application No. PCT/CN2020/079758, filed on Mar. 17, 2020 which claims priority of the Chinese Patent Application No. 201910373155.2, filed to the Chinese Patent Office on May 6, 2019 and entitled "DISPLAY DEVICE AND DEFORMATION DETECTION METHOD THEREOF", the entire content of which is incorporated herein by reference.

FIELD

The present disclosure relates to the technical field of display, particularly a flexible display panel, a flexible display device and a deformation detection method thereof.

BACKGROUND

Due to advantages such as bright color, good viewing angles, high contrast ratio, fast response and low power consumption, an active-matrix organic light-emitting diode (AMOLED) display device gets a lot of attention. A flexible AMOLED display device has wider application prospects in the future display field, and has wide application spaces in multiple display fields such as mobile display, on-board display and medical display.

SUMMARY

Embodiments of the present disclosure provide a flexible display panel, including:
  a flexible substrate;
  a display device positioned on one side of the flexible substrate; and
  a piezoelectric sensor positioned on one side of the flexible substrate, wherein the piezoelectric sensor includes: a first electrode, a second electrode, and a piezoelectric layer positioned between the first electrode and the second electrode; the piezoelectric sensor is configured to generate an electrical signal under the action of stress produced by bending the flexible display panel.

Optionally, in the flexible display panel provided by embodiments of the present disclosure, the piezoelectric sensor is positioned between the flexible substrate and the display device.

Optionally, in the flexible display panel provided by embodiments of the present disclosure, the piezoelectric sensor is positioned on one side facing away from the display device, of the flexible substrate.

Optionally, in the flexible display panel provided by embodiments of the present disclosure, the piezoelectric sensor is positioned on one side facing away from the flexible substrate, of the display device.

Optionally, in the flexible display panel provided by embodiments of the present disclosure, the first electrode is positioned on one side facing away from the display device, of the piezoelectric layer; and a section of the first electrode has a concave-convex shape, wherein the section is perpendicular to an extension direction of a bent axis of the flexible display panel.

Optionally, in the flexible display panel provided by embodiments of the present disclosure, the flexible display panel further includes multiple heightening layers arranged at intervals on one side facing away from the piezoelectric layer, of the first electrode; and the heightening layers coincide with convex areas of the first electrode towards one side of the piezoelectric layer.

Optionally, in the flexible display panel provided by embodiments of the present disclosure, orthographic projections of the heightening layers on the flexible substrate are of a strip shape; and extension directions of the strip shapes are same as the extension direction of the bent axis of the flexible display panel.

Optionally, in the flexible display panel provided by embodiments of the present disclosure, the flexible display panel has multiple bending areas, and includes multiple piezoelectric sensors in one-one correspondence with the bending areas.

Optionally, in the flexible display panel provided by embodiments of the present disclosure, a material of the piezoelectric layer is polyvinylidene fluoride (PVDF).

Optionally, in the flexible display panel provided by embodiments of the present disclosure, the display device is an organic light-emitting diode (OLED) display device.

Embodiments of the present disclosure further provide a flexible display device including the flexible display panel provided by embodiments of the present disclosure and a signal processing chip;
  the signal processing chip is electrically connected with the first electrode and the second electrode through a flexible printed circuit board, and configured to determine deformation parameters of the flexible display panel according to an electrical signal generated by the piezoelectric sensor.

Embodiments of the present disclosure further provide a deformation detection method of the flexible display device. The method includes the following steps:
  detecting an electrical signal generated by a piezoelectric sensor under the action of stress produced by bending a flexible display panel; and
  determining deformation parameters of the flexible display panel based on the detected electrical signal.

Optionally, the determining deformation parameters of the flexible display panel includes:
  determining a bending position of the flexible display panel;
  after the determining deformation parameters of the flexible display panel based on the detected electrical signal, the method further includes:
  determining a current operation of the flexible display panel that needs to be executed based on the determined bending position of the flexible display panel and a preset corresponding relation between a bending position of the flexible display panel and an operation of the flexible display panel that needs to be executed.

DETAILED DESCRIPTION OF THE EMBODIMENTS

A stress change of an AMOLED display device in the related art cannot be detected by itself during deformation. Thus, a bending degree of the display device cannot be determined; excessive bending of the display device cannot be avoided; and a new function of the display device cannot be developed by utilizing bending of the display device.

Based on this, an embodiment of the present disclosure provides a flexible display panel, a flexible display device and a deformation detection method thereof. To make objectives, technical solutions and advantages of the present disclosure clearer, specific embodiments of the flexible display panel, the flexible display device and the deformation detection method thereof provided by the embodiments of the present disclosure are described in detail in combination with the drawings. It should be understood that, preferred embodiments described below are merely used for describing and explaining the present disclosure, rather than a limitation of the present disclosure. Moreover, embodiments in the present disclosure and features in the embodiments may be combined with one another without conflict.

Figure 1:
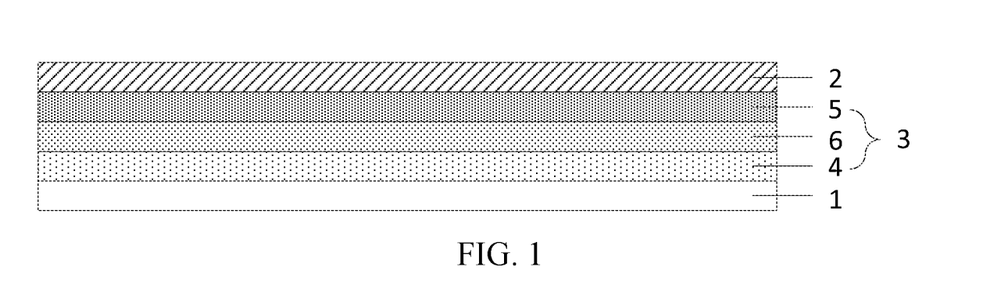
FIG. 1 is a structural schematic diagram of a flexible display panel provided by an embodiment of the present disclosure.
Figure 2:
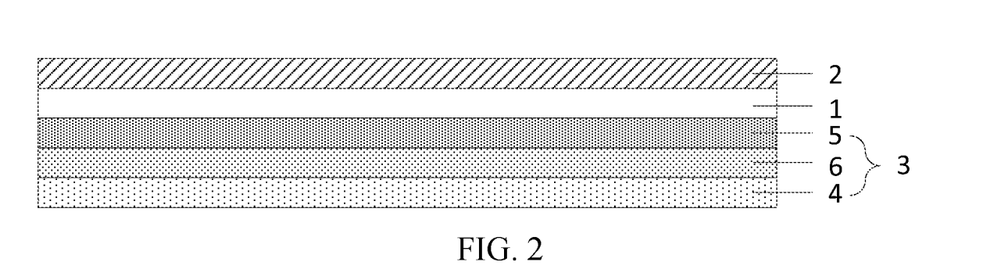
FIG. 2 is a structural schematic diagram of another flexible display panel provided by an embodiment of the present disclosure.
Figure 3:
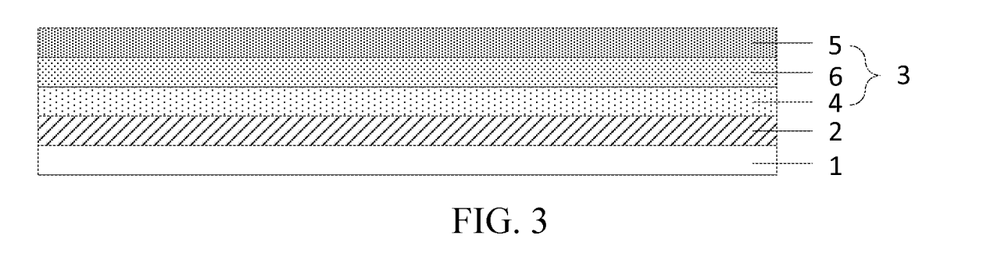
FIG. 3 is a structural schematic diagram of another flexible display panel provided by an embodiment of the present disclosure.

Embodiments of the present disclosure provide a flexible display panel. As shown in FIGS. 1-3, the flexible display panel includes:
- a flexible substrate 1;
- a display device 2, positioned on one side of the flexible substrate 1; and
- a piezoelectric sensor 3, positioned on one side of the flexible substrate 1. The piezoelectric sensor 3 includes a first electrode 4, a second electrode 5, and a piezoelectric layer 6 positioned between the first electrode 4 and the second electrode 5; and the piezoelectric sensor 3 is configured to generate an electrical signal under the action of stress produced by bending the flexible display panel.

In the flexible display panel provided by embodiments of the present disclosure, due to the arranged piezoelectric sensor 3, the electrical signal is generated when the piezoelectric sensor 3 deforms. Therefore, when the flexible display panel provided by the present disclosure deforms, deformation parameters of the flexible display panel may be determined by virtue of the electrical signal of the piezoelectric sensor 3, thereby detecting deformation of the flexible display panel.

Optionally, in the flexible display panel provided by embodiments of the present disclosure, a material of the piezoelectric layer 6 may be polyvinylidene fluoride (PVDF).

The PVDF has excellent piezoelectric property, and also has advantages such as thinness, simple structure, excellent ductility and good dynamic property. In actual applications, the PVDF may be made into arbitrary shapes. Thus, the piezoelectric property of the piezoelectric layer 6 is not affected under a condition that the flexible display panel deforms, and detection of the deformation parameters of the flexible display panel is not influenced by the piezoelectric sensor 3.

Certainly, in the flexible display panel provided by embodiments of the present disclosure, the material of the piezoelectric layer 6 may also be other flexible piezoelectric materials. The material is not defined herein.

By taking the material of the piezoelectric layer 6 being PVDF as an example, a principle of detecting the deformation of the piezoelectric sensor 3 is briefly introduced below.

The piezoelectric sensor 3 is manufactured based on a piezoelectric effect. A piezoelectric equation is followed during operation as follows:

$$D = eS + \varepsilon^S E, \quad \text{Formula I}$$

where, D is an electric displacement; e is a piezoelectric stress coefficient; S is strain; $\varepsilon^S$ is a dielectric constant when the strain is constant; and E is electric field intensity.

A three-dimensional PVDF piezoelectric layer conforms to a direct piezoelectric effect, and the above formula I may be written as follows:

$$D_i = e_{ij} S_j, \quad \text{Formula II}$$

where, i=1, 2 and 3; j=1, 2, 3, 4, 5 and 6; i is a polarization direction of crystal; when a surface on which an electric charge is generated is perpendicular to an axis X, i=1; when a surface on which the electric charge is generated is perpendicular to an axis Y, i=2; when a surface on which the electric charge is generated is perpendicular to an axis Z, i=3; and j=1, 2, 3 respectively represent uniaxial stress along the axis X, axis Y and axis Z and shear stress acting in the surfaces perpendicular to the axis X, axis Y and axis Z.

When a three-dimensional PVDF piezoelectric film material works, the above formula II may be written as follows:

$$\begin{bmatrix} D1 \\ D2 \\ D3 \end{bmatrix} = \begin{bmatrix} 0 & 0 & 0 & 0 & 0 & e_{16} \\ 0 & 0 & 0 & 0 & e_{25} & 0 \\ e_{31} & e_{32} & e_{33} & 0 & 0 & 0 \end{bmatrix} \begin{bmatrix} S1 \\ S2 \\ S3 \\ S4 \\ S5 \\ S6 \end{bmatrix}. \quad \text{Formula III}$$

Figure 4:
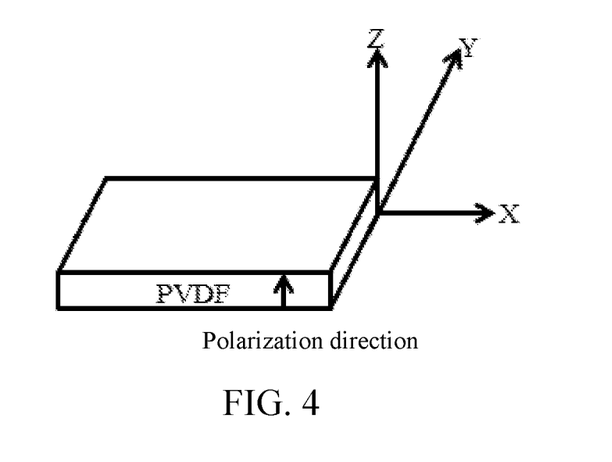
FIG. 4 is a schematic diagram of polarization of a PVDF piezoelectric layer in a piezoelectric sensor provided by an embodiment of the present disclosure.

As shown in FIG. 4, since the piezoelectric sensor 3 is polarized in a direction Z of the PVDF during preparation, i.e., polarized in a thickness direction, the formula III may be further simplified as a following formula:

$$D_3 = e_{31} S1 + e_{32} S2 + e_{33} S3. \quad \text{Formula IV}$$

Figure 5:
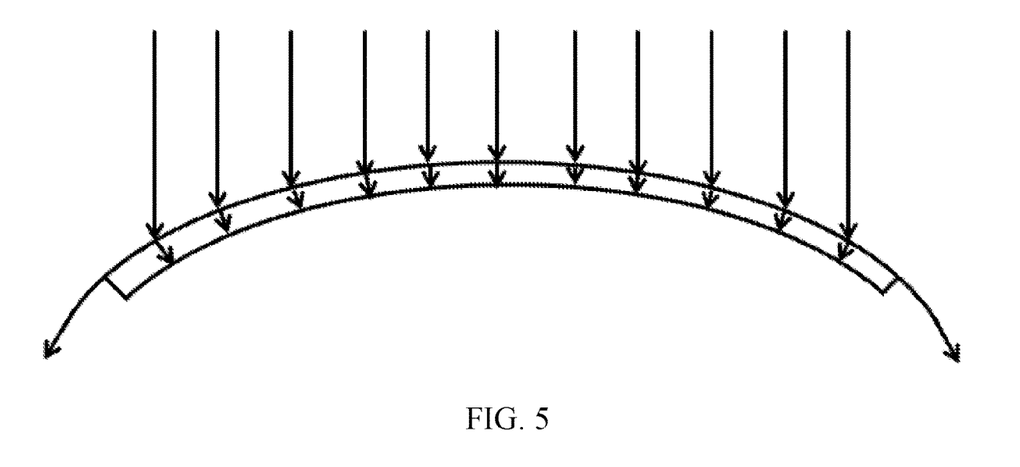
FIG. 5 is a schematic diagram of an acting force borne by a flexible display panel having deformation provided by an embodiment of the present disclosure.

For the flexible display panel, when the flexible display panel has deformations such as folding, bending and even curling, as shown in FIG. 5, the piezoelectric sensor 3 is mainly subject to a tensile force in an intra-film horizontal direction, and stress on the film surface may be transformed into shear stress in a direction perpendicular to the film surface. Therefore, the third item in the formula IV is negligible. In addition, during an actual operation of the piezoelectric sensor 3, the influence of strain of the first item in the formula IV is much greater than that of the second item. Thus, the formula IV may be simplified as follows:

$$D3 = e_{31}S1. \qquad \text{Formula V}$$

Therefore, an electric displacement signal output by the piezoelectric sensor 3 in the actual operation is directly related to stress S1 in the intra-film horizontal direction borne by the flexible display panel, thereby transforming the action of bending a flexible display screen into a corresponding electrical signal.

Figure 9:
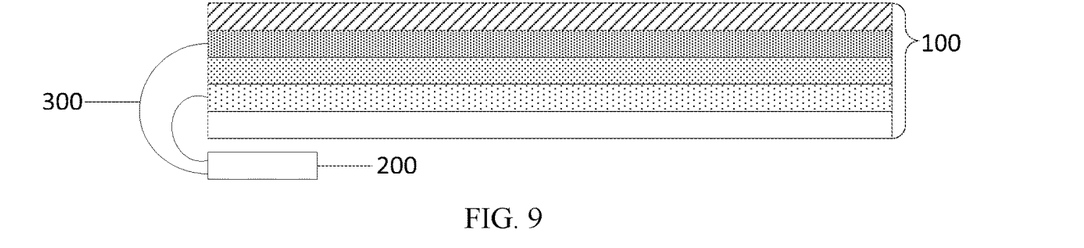
FIG. 9 is a structural schematic diagram of a flexible display device provided by an embodiment of the present disclosure.

Based on the same inventive concept, embodiments of the present disclosure further provide a flexible display device. As shown in FIG. 9, the flexible display device includes a flexible display panel 100 and a signal processing chip 200. A first electrode 4 and a second electrode 5 may be electrically connected with the signal processing chip 200 by virtue of a flexible printed circuit board 300 (FPC). The signal processing chip 200 is configured to determine deformation parameters of the flexible display panel according to the electrical signal generated by the piezoelectric sensor 3.

Optionally, the deformation parameters of the flexible display panel may include, for example, whether the flexible display panel bends and a bending position of the flexible display panel. According to the flexible display device provided by embodiments of the present disclosure, since the deformation of the flexible display panel may be detected by utilizing the piezoelectric sensor 3 inside the display panel, functions of the flexible display panel can be enriched in combination with the bendable characteristic of the flexible display panel. For example, interaction between a user and the flexible display device may be realized by detecting the bending parameter. The flexible display device may be a mobile phone. The interaction between the user and the mobile phone is realized by detecting the bending parameter of the flexible display device, for example, when the mobile phone is in a folded state and there is a phone call, the phone call may be answered when it is detected that the mobile phone is changed from a bent state to an unfolded state; when the screen of the mobile phone is off, a camera is controlled to open when it is detected that the upper half part of the screen is bent; or a specific application (APP) is opened by bending a certain specific position.

Optionally, according to the flexible display panel as shown in FIG. 1 provided by embodiments of the present disclosure, the piezoelectric sensor 3 may be positioned between the flexible substrate 1 and the display device 2.

Optionally, according to the flexible display panel as shown in FIG. 2 provided by embodiments of the present disclosure, the piezoelectric sensor 3 may be positioned on one side of the flexible substrate 1 facing away from the display device 2.

In the flexible display panel provided by embodiments of the present disclosure, when the piezoelectric sensor 3 is positioned between the flexible substrate 1 and the display device 2, or when the piezoelectric sensor 3 is positioned on one side of the flexible substrate 1 facing away from the display device 2, light emission of the display device 2 is not affected by the piezoelectric sensor 3, thereby not influencing light-emitting brightness and light-emitting efficiency of the flexible display panel.

Optionally, according to the flexible display panel as shown in FIG. 3 provided by embodiments of the present disclosure, the piezoelectric sensor 3 may be positioned on one side of the display device 2 facing away from the flexible substrate 1.

It should be indicated that, when the piezoelectric sensor 3 is positioned on one side of the display device 2 facing away from the flexible substrate 1, i.e., the piezoelectric sensor 3 is positioned on a light-emitting side of the display device 2, a material of the piezoelectric sensor 3 needs to be a transparent material. Thus, light emission of the display device 2 is not affected by the piezoelectric sensor 3.

In the flexible display panel provided by embodiments of the present disclosure, the display device 2 may be generally manufactured by the OLED display device, so as to facilitate flexible display.

During bending, an outer layer of the material is stretched, while an inner layer is squeezed. Thus, there is necessarily a transition layer that is neither stretched nor squeezed on the section of the material. The stress is almost equal to zero, and the transition layer is called a neutral layer of the material. In the bending process, a length of the neutral layer is the same as that before bending and is kept invariable. In the flexible display panel provided by embodiments of the present disclosure, the neutral layer is generally arranged on the display device 2 so as to prevent the breakage risk of the display device 2 in the bending process. However, for the piezoelectric sensor 3, an electrode away from a neutral surface has a risk of breakage under the action of too high stress.

Based on this, optionally, in the flexible display panel provided by embodiments of the present disclosure, when the first electrode 4 is positioned on one side of the piezoelectric layer 6 away from the display device 2, the first electrode 4 may have a concave-convex shape at a section perpendicular to an extension direction of a bent axis of the flexible display panel.

In the flexible display panel provided by embodiments of the present disclosure, the first electrode 4, in the piezoelectric sensor 3, away from the neutral layer has the concave-convex shape at the section perpendicular to the extension direction of the bent axis of the flexible display panel, thereby reducing breakage risk of the first electrode 4 under stress.

Figure 6:
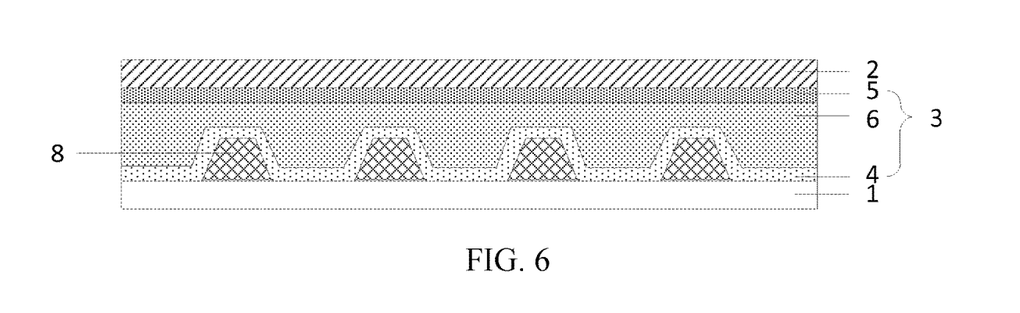
FIG. 6 is a structural schematic diagram of another flexible display panel provided by an embodiment of the present disclosure.

By taking the piezoelectric sensor 3 positioned between the flexible substrate 1 and the display device 2 as an example, as shown in FIG. 6, the first electrode 4 is positioned on one side of the piezoelectric layer 6 away from the display device; and the first electrode 4 has the concave-convex shape at the section perpendicular to the extension direction of the bent axis of the flexible display panel.

Optionally, in the flexible display panel provided by embodiments of the present disclosure, as shown in FIG. 6, the flexible display panel may further include: multiple heightening layers 8 arranged at intervals on one side of the first electrode 4 facing away from the piezoelectric layer 6; and the heightening layers 8 coincide with convex areas of the first electrode 4 towards one side of the piezoelectric layer 6.

According to the flexible display panel provided by embodiments of the present disclosure, through the arrangement of the multiple heightening layers 8 and the first electrode 4 in sequence, the first electrode 4 has the concave-convex shape at the section perpendicular to the extension direction of the bent axis of the flexible display panel, thereby reducing the breakage risk of the first electrode 4 under stress.

Figure 7:
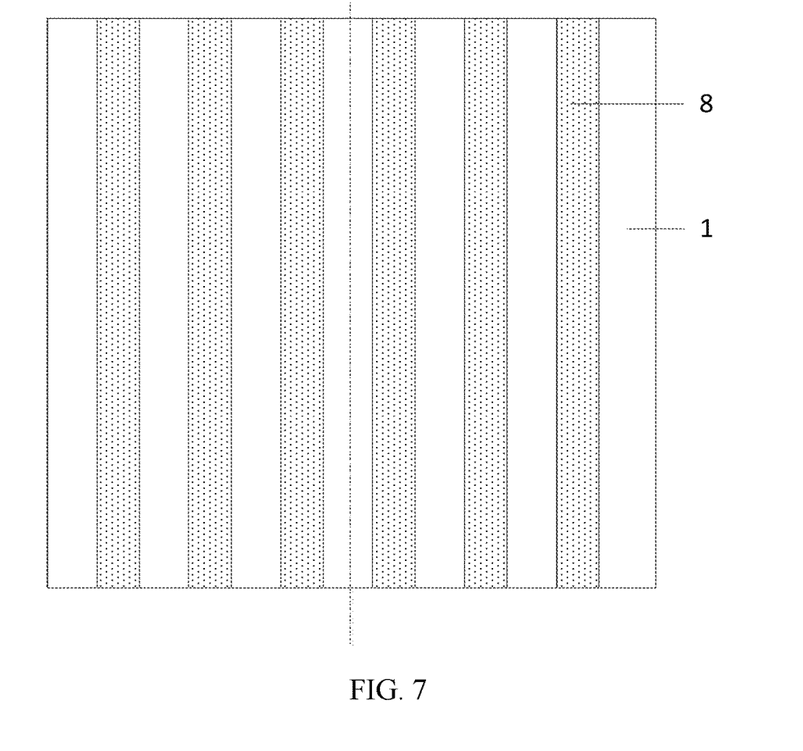
FIG. 7 is a structural schematic diagram of another flexible display panel provided by an embodiment of the present disclosure.

Optionally, in the flexible display panel provided by embodiments of the present disclosure, as shown in FIG. 7, orthographic projections of the heightening layers 8 on the flexible substrate 1 may be of a strip shape; and extension directions of the strip shapes are the same as the extension direction of the bent axis 9 of the flexible display panel.

Figure 8:
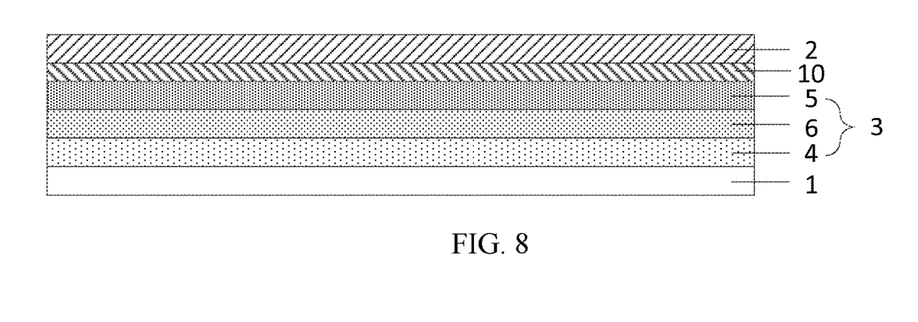
FIG. 8 is a structural schematic diagram of another flexible display panel provided by an embodiment of the present disclosure.

When the piezoelectric sensor 3 is positioned between the flexible substrate 1 and the display device 2, optionally, as shown in FIG. 8, the flexible display panel provided by embodiments of the present disclosure may further include: a buffer layer 10 positioned between the piezoelectric sensor 3 and the display device 2.

Optionally, according to the flexible display panel provided by embodiments of the present disclosure, the display device 2 may include: a drive circuit composed of thin film transistors (TFTs) and an organic light-emitting diode (OLED) in electrical connection with the drive circuit. The drive circuit and the OLED may be considered to form an OLED display device.

Figure 10:
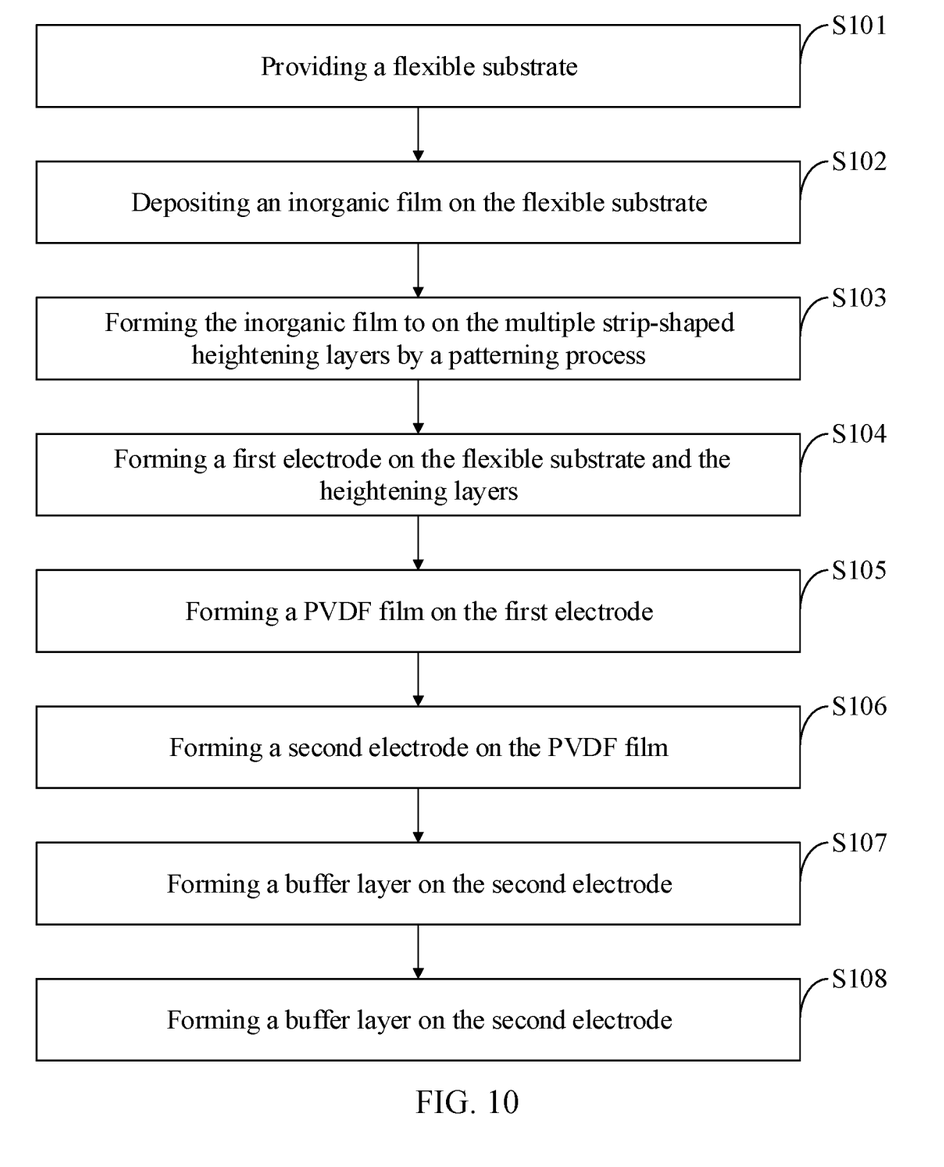
FIG. 10 is a schematic diagram of a preparation method of a flexible display panel provided by an embodiment of the present disclosure.

By taking the piezoelectric sensor 3 positioned between the flexible substrate 1 and the display device 2 as an example again, a preparation method of the flexible display panel provided by embodiments of the present disclosure is illustrated. As shown in FIG. 10, the preparation method of the flexible display panel may include:

S101: providing a flexible substrate;
S102: depositing an inorganic film on the flexible substrate;
S103: forming multiple strip-shaped heightening layers on the inorganic film by a patterning process;
S104: forming a first electrode on the flexible substrate and the heightening layers;
wherein, for example, an indium tin oxide (ITO) film may be deposited on the flexible substrate and the heightening layers;
a material of the first electrode may be metals such as molybdenum (Mo), aluminum (Al) and copper (Cu);
S105: forming a PVDF film on the first electrode;
wherein, the PVDF film may be formed by processes such as coating, curing and polarization;
S106: forming a second electrode on the PVDF film;
S107: forming a buffer layer on the second electrode; and
S108: forming a display device on the buffer layer.

For example, a TFT and an OLED are formed on the buffer layer.

Optionally, in the flexible display panel provided by embodiments of the present disclosure, the flexible display panel may have multiple bending areas. Correspondingly, the flexible display panel may include multiple piezoelectric sensors 3 in one-one correspondence with the bending areas.

It should be indicated that, the flexible display panel provided by embodiments of the present disclosure may include one piezoelectric sensor 3 only, and may also include multiple piezoelectric sensors 3. When the flexible display panel includes one piezoelectric sensor 3 only, the piezoelectric sensor 3 may wholly cover all areas of the flexible display panel, thus a potential change at any position of the flexible display panel may be detected. When the flexible display panel includes multiple piezoelectric sensors 3, the piezoelectric sensors 3 are in one-one correspondence with the bending areas, i.e., deformation parameters in different areas are separately detected by utilizing the piezoelectric sensors 3. The quantity and positions of the piezoelectric sensors 3 may be set according to actual needs.

Figure 11:
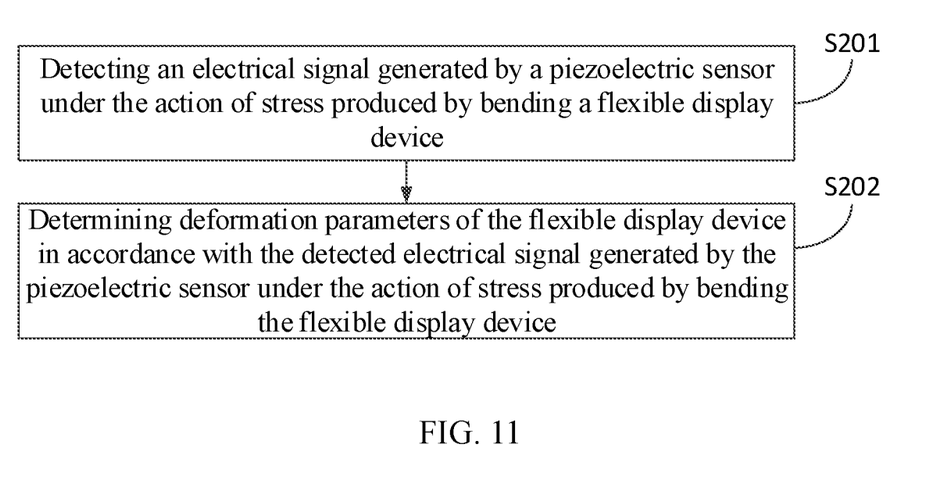
FIG. 11 is a schematic diagram of a deformation detection method of a flexible display device provided by an embodiment of the present disclosure.

Based on the same inventive concept, embodiments of the present disclosure provide a deformation detection method of the flexible display device. As shown in FIG. 11, the method includes:

S201: detecting an electrical signal generated by a piezoelectric sensor under the action of stress produced by bending a flexible display panel; and
S202: determining deformation parameters of the flexible display panel based on the detected electrical signal generated by the piezoelectric sensor under the action of stress produced by bending the flexible display panel.

According to the deformation detection method of the flexible display device provided by embodiments of the present disclosure, the flexible display panel includes the piezoelectric sensor, and the arranged piezoelectric sensor may generate an electrical signal while deforming. Therefore, the deformation parameters of the flexible display device may be determined by the electrical signal of the piezoelectric sensor, thereby detecting the deformation of the flexible display panel.

Optionally, the step of determining deformation parameters of the flexible display panel includes:

determining a bending position of the flexible display panel.

After the step of determining deformation parameters of the flexible display panel in accordance with the detected electrical signal generated by the piezoelectric sensor under the action of stress produced by bending the flexible display panel, the method further includes:

determining a current operation of the flexible display panel that needs to be executed based on the determined bending position of the flexible display panel and a preset corresponding relation between a bending position of the flexible display panel and an operation of the flexible display panel that needs to be executed.

It should be indicated that, when the flexible display device is a mobile phone, operations of the flexible display device that need to be executed may include operations of answering a call or hanging up, enabling or disenabling a camera function of the mobile phone, opening or closing an APP, and the like. For example, when the mobile phone is in a folded state and there is a phone call, the phone call may be answered when it is detected that the mobile phone is unfolded; when the screen of the mobile phone is off, a camera is controlled to open when it is detected that the upper half part of the screen is bent; or when it is detected that a certain area of the mobile phone is bent, an application (APP) corresponding to the area is opened.

To sum up, according to the flexible display panel, the flexible display device and the deformation detection method thereof provided by embodiments of the present disclosure, since the piezoelectric sensor generates the electrical signal while deforming, when the flexible display panel deforms, the deformation parameters of the flexible display panel may be determined by the electrical signal of the piezoelectric sensor, thereby detecting the deformation of the flexible display panel. The functions of the flexible display device can be enriched in combination with the bendable characteristic of the flexible display panel. Thus, the interaction between the user and the flexible display device may be realized by detecting the bending parameter.

Apparently, various modifications and transformations of the present disclosure may be made by those skilled in the art without departing from the spirit or scope of the present disclosure. Thus, if these modifications and transformations of the present disclosure belong to the scope of claims of the present disclosure and equivalent technologies of the present disclosure, the present disclosure is intended to include these modifications and transformations.

The invention claimed is:

1. A flexible display panel, comprising:
a flexible substrate;
a display device positioned on one side of the flexible substrate; and
a piezoelectric sensor positioned on one side of the flexible substrate, wherein the piezoelectric sensor comprises a first electrode, a second electrode, and a piezoelectric layer positioned between the first electrode and the second electrode; and the piezoelectric sensor is configured to generate an electrical signal under an action of stress produced by bending the flexible display panel;
wherein the first electrode is positioned on one side facing away from the display device, of the piezoelectric layer; and a section of the first electrode has a concave-convex shape, wherein the section is perpendicular to an extension direction of a bent axis of the flexible display panel;
wherein the flexible display panel further comprising:
multiple heightening layers arranged at intervals on one side facing away from the piezoelectric layer, of the first electrode; and the heightening layers coincide with convex areas of the first electrode towards one side of the piezoelectric layer.

2. The flexible display panel according to claim 1, wherein the piezoelectric sensor is positioned between the flexible substrate and the display device.

3. The flexible display panel according to claim 1, wherein the piezoelectric sensor is positioned on one side facing away from the display device, of the flexible substrate.

4. The flexible display panel according to claim 1, wherein the piezoelectric sensor is positioned on one side facing away from the flexible substrate, of the display device.

5. The flexible display panel according to claim 1, wherein orthographic projections of the heightening layers on the flexible substrate are of a strip shape; and extension directions of the strip shapes are same as the extension direction of the bent axis of the flexible display panel.

6. The flexible display panel according to claim 1, wherein the flexible display panel has multiple bending areas, and the flexible display panel comprises a plurality of the piezoelectric sensors in one-one correspondence with the bending areas.

7. The flexible display panel according to claim 1, wherein a material of the piezoelectric layer is polyvinylidene fluoride (PVDF).

8. The flexible display panel according to claim 1, wherein the display device is an OLED display device.

9. A flexible display device, comprising the flexible display panel according to claim 1 and a signal processing chip,
wherein, the signal processing chip is electrically connected with the first electrode and the second electrode through a flexible printed circuit board, and the signal processing chip is configured to determine deformation parameters of the flexible display panel according to an electrical signal generated by the piezoelectric sensor.

10. A deformation detection method of the flexible display device according to claim 9, comprising:
detecting an electrical signal generated by the piezoelectric sensor under an action of stress produced by bending the flexible display panel; and
determining deformation parameters of the flexible display panel based on detected electrical signal.

11. The method according to claim 10, wherein the determining deformation parameters of the flexible display panel comprises:
determining a bending position of the flexible display panel;
after the determining deformation parameters of the flexible display panel based on the detected electrical signal, the method further comprises:
determining a current operation of the flexible display panel that needs to be executed based on the determined bending position of the flexible display panel and a preset corresponding relation between a bending position of the flexible display panel and an operation of the flexible display panel that needs to be executed.

* * * * *

UNITED STATES PATENT AND TRADEMARK OFFICE
CERTIFICATE OF CORRECTION

| | | |
|---|---|---|
| PATENT NO. | : 11,538,870 B2 | Page 1 of 1 |
| APPLICATION NO. | : 17/043205 | |
| DATED | : December 27, 2022 | |
| INVENTOR(S) | : Wenqiang Li et al. | |

It is certified that error appears in the above-identified patent and that said Letters Patent is hereby corrected as shown below:

On the Title Page

The Assignees should read:
Chengdu BOE Optoelectronics Technology Co., Ltd. Chengdu, Sichuan, CHINA
BEIJING BOE TECHNOLOGY DEVELOPMENT CO., LTD. Beijing, CHINA Signed and Sealed this
Twenty-first Day of March, 2023

Katherine Kelly Vidal
*Director of the United States Patent and Trademark Office*